United States Patent [19]
Lagowski et al.

[11] Patent Number: 6,037,797
[45] Date of Patent: Mar. 14, 2000

[54] MEASUREMENT OF THE INTERFACE TRAP CHARGE IN AN OXIDE SEMICONDUCTOR LAYER INTERFACE

[75] Inventors: Jacek Lagowski; Piotr Edelman, both of Tampa; Marshall D. Wilson, Lutz, all of Fla.

[73] Assignee: Semiconductor Diagnostics, Inc., Tampa, Fla.

[21] Appl. No.: 08/893,404

[22] Filed: Jul. 11, 1997

[51] Int. Cl.[7] .............................. G01R 31/26; G01R 1/04
[52] U.S. Cl. ...................... 324/766; 324/158.1; 324/765
[58] Field of Search .................... 324/158, 765, 324/766

[56] References Cited

U.S. PATENT DOCUMENTS

| | | | |
|---|---|---|---|
| 3,859,595 | 1/1975 | Lang | 324/158 |
| 4,168,432 | 9/1979 | Williams et al. | 250/370 |
| 4,326,165 | 4/1982 | Szedom | 324/158 |
| 4,393,348 | 7/1983 | Goldstein et al. | 324/158 |
| 4,433,288 | 2/1984 | Moore | 324/158 |
| 4,581,578 | 4/1986 | Homma et al. | 324/158 |
| 4,599,558 | 7/1986 | Castellano, Jr. et al. | 324/158 |
| 4,744,833 | 5/1988 | Cooper et al. | 134/1 |
| 4,755,746 | 7/1988 | Mallory et al. | 324/158 |
| 4,812,756 | 3/1989 | Curtis et al. | 324/158 |
| 4,827,212 | 5/1989 | Kamieniecki | 324/158 |
| 4,851,767 | 7/1989 | Halbout et al. | 324/158 |
| 4,859,939 | 8/1989 | Gittleman et al. | 324/158 |
| 4,891,584 | 1/1990 | Kamieniecki et al. | 324/158 |
| 4,950,977 | 8/1990 | Garcia et al. | 324/71.1 |
| 4,978,915 | 12/1990 | Andrews, Jr. et al. | 324/158 |
| 5,025,145 | 6/1991 | Lagowski | 250/211 |
| 5,087,876 | 2/1992 | Reiss et al. | 324/158 |
| 5,091,691 | 2/1992 | Kamieniecki et al. | 324/158 |
| 5,126,660 | 6/1992 | Harvey et al. | 324/158 |
| 5,177,351 | 1/1993 | Lagowski | 250/215 |
| 5,216,362 | 6/1993 | Verkuil | 324/158 |
| 5,394,101 | 2/1995 | Mitros | 324/760 |
| 5,410,162 | 4/1995 | Tigelaar et al. | 257/48 |
| 5,461,328 | 10/1995 | Devereaux et al. | 324/765 |
| 5,498,974 | 3/1996 | Verkuil et al. | 324/767 |
| 5,506,498 | 4/1996 | Anderson et al. | 324/158 |
| 5,519,334 | 5/1996 | Dawson | 324/765 |
| 5,663,657 | 9/1997 | Lagowski et al. | 324/766 |
| 5,773,989 | 6/1998 | Edelman et al. | 324/765 |

OTHER PUBLICATIONS

Bickley, "Quantox™ Non–Contact Oxide Monitoring System", Keithley Instruments, Inc., (1995).

Edelman, "New approach to measuring oxide charge and mobile ion concentration", SPIE, 2337:154–164, (1994).

Horner et al., "COS–Based Q–V Testing: In–Line Options for Oxide charge Monitoring", IEEE, 63–67, (1995).

Horner et al., "Monitoring electrically active contaminants to assess oxide quality", Solid State Tech., 79–84, (1995).

Jastrzebski et al., "Real–time, preparation–free imaging of mobile charge in $SiO_2$", To be presented at Optical Characterization Techniques for High–Performance Microelectronic Manufacturing, Austin, TX, SPIE Proceedings vol. 2877, (1996).

(List continued on next page.)

*Primary Examiner*—Josie Ballato
*Assistant Examiner*—Jermele M. Hollington
*Attorney, Agent, or Firm*—Fish & Richardson P.C.

[57] ABSTRACT

A method of determining charge associated with traps present in a semiconductor oxide interface is described. The method includes the steps of depositing a dose of charge over a surface of the oxide and measuring a resultant value of surface potential barrier at the portion of the surface. From the measured value of surface charge and deposited charge dose a value of charge associated with the interface trap is determined. The method also includes determining space charge corresponding to the measured surface potential barrier of the portion of the substrate. With the determined space charge and known deposited charge the interface trapped charge is determined by noting that the change in interface trapped charge is related to the negative of the changes in space charge and deposited charge.

20 Claims, 13 Drawing Sheets

OTHER PUBLICATIONS

Kamieniecki et al., "A New Method for In–Line, Real–Time Monitoring of Wafer Cleaning Operations", Symposium on Ultra Clean Processing of Silicon Surfaces, UCPSS, Bruges, Belgium (1994).

Kamieniecki, "Surface photovoltage measured capacitance: Application to semiconductor/ electrolyte system", J. Appl. Phys., 54(11):6481–6487, (1983).

Keithley, Quantox™ Engineering Manual, 1996.

Schroder, "Chapter 6, Oxide and Interface Trapped Charge", Semiconductor Material and Device Characterization, Publisher John Wiley & Sons, Inc. pp. 244–291, (1990), month unavailable Semiconductor Diagnostics Activity prior to Sep. 26, 1993.

Verkuil et al., "A contactless Alternative to MOS Charge Measurements by Means of a Corona–Oxide–Semiconductor (COS) Technique", Extended Abstracts, 88–1:261–262, (1988).

Lagowski, J., "A Method for Determining the Minority Carrier Lifetime in Epitaxial Layers by Elevated Temperature . . . ", Presented at Jp. SEMI Meeting, Oct. 7, 1997, Tokyo Japan.

Munakata et al., "Non–Destructive Method for Measuring Cut–Off Frequency of a p–n Junction with a Chopped Photon Beam", Japanese Journal of Applied Physics 20:L856–L858, 1981.

Munakata et al., "A Non–Destructive Method for Measuring Lifetimes for Minority Carrier in Semiconductor Wafers . . . ", Japanese Journal of Applied Physics 22:L103–L105, 1983.

Munakata et al., "Ac Surface Photovoltages in Strongly–Inverted Oxidized p–Type Silicon Wafers", Japanese Journal of Applied Physics 23:1451–1461, 1984.

Munakata et al., "Analysis of ac Surface Photovoltages in a Depleted Oxidized p–Type Silicon Wafer", Japanese Journal of Applied Physics 25:807–812, 1986.

Honma et al., "Simplified AC Photovoltaic Measurement of Minority Carrier Lifetime in Czochralski–Grown Silicon Wafers . . . ", Japanese Journal of Applied Physics 32:3639–3642, 1993.

Schroder, D.K., "Semiconductor Material and Devive Characterization, Chapter 8", John Wiley & Sons, Inc., pp. 359–365, (1990), month unavailable.

Verkuil, Contactless Alternatives to MOS Charge Measurements, Abstract No. 525, Fall Meeting, pp. 1313–1315, (1980).

Kang et al., "The Pulsed MIS Capacitor", Phys. Stat. Sol. 89:14–43, 1985.

Nicollian et al., "MOS (Metal Oxide Semiconductor) Physics and Technology, Chapter 4, pp. 99–153", John Wiley & Sons.

$Q_{C1} \ldots Q_{C4}$ CORONA CHARGE DOVES
$V_{S1} \ldots V_{S4}$ SURFACE POTENTIAL BARRIER PLOT $V_s$ vs. $Q_c$

FULL EQUATION FOR DEPLETION $$Q^2 = 2q\varepsilon_S N_A [V_s + \frac{KT}{q}(e^{\frac{qV_s}{ET}} - 1)]$$

SHORT DEPLETION LAYER EXPRESSION FOR $V_s > \frac{KT}{q}$ $$Q^2 = 2q\varepsilon_S N_A [V_s - \frac{KT}{q}]$$

MEASUREMENT OF THE INTERFACE TRAP CHARGE IN AN OXIDE SEMICONDUCTOR LAYER INTERFACE

BACKGROUND OF THE INVENTION

The invention relates to semiconductor wafer testing and more particularly to characterization of semiconductor/oxide interface traps.

As is known in the art, semiconductor wafers often contain material interfaces such as silicon and silicon dioxide. Contaminants and other defects at the oxide silicon interface can cause problems in the manufacture and performance of integrated circuits that are fabricated over the interface. For example, impurities such as metals are often introduced at the oxide layer/semiconductor interface during oxidation processing, plasma deposition or etching or other processing. There is a need to determine the quality of this interface prior to or during the manufacture of semiconductor devices on the wafer.

While prior approaches are known they all rely upon a very indirect measurement of the interface trapped charge. In general the prior approaches use charge-voltage dependence, capacitance-voltage or capacitance-time dependence. In general, they require the fabrication of test structures, such as electrodes on the surface of the wafer or capacitors. This is time-consuming and expensive. Hence a better approach is needed.

SUMMARY OF THE INVENTION

In accordance with the present invention, a method of determining charge associated with traps present in a semiconductor oxide interface includes the steps of depositing a dose of charge over a surface of the oxide and measuring a resultant value of surface potential barrier at the portion of the surface. From the measured value of surface potential barrier and deposited charge dose a value of charge falling in the interface trap is determined. With such an arrangement, interface trap charge is determined in accordance with deposited charge placed upon the semiconductor surface. This method does not require fabrication of test structures or contacts on the surface of the wafer. Therefore the method is direct and potentially more accurate than prior approaches and it is very fast and suitable for mapping of interface trapped charge over the entire wafer. This method contrary to prior art approaches uses a charge-charge (Q—Q) technique to measure trapped interface charge. That is, a contactless method that does not rely upon the formation of test structures for measuring capacitance or voltage is provided.

In accordance with a further aspect of the present invention, an apparatus for determining charge associated with traps present in a semiconductor oxide interface includes a corona discharge station for depositing a dose of charge over a surface of the oxide, and a measurement station for measuring a resultant value of surface potential barrier at the surface. The apparatus also includes means such as a computer for determining from the surface potential barrier and the deposited charge dose a value of charge associated with the interface trap. With such an arrangement, an apparatus determines interface trap charge by noting a deposited charge placed upon the semiconductor surface and measuring a resulting change in surface charge surface potential barrier. The apparatus does not require fabrication of test structures or contacts on the surface of the wafer. Therefore the apparatus provides a more direct and potentially more accurate measurement than prior approaches. The apparatus is very fast and thus suitable for mapping of interface trapped charge over the entire wafer. Contrary to prior art approaches the apparatus uses a charge-charge (Q—Q) technique to measure trapped interface charge.

DESCRIPTION OF THE PREFERRED EMBODIMENTS

Figure 1:
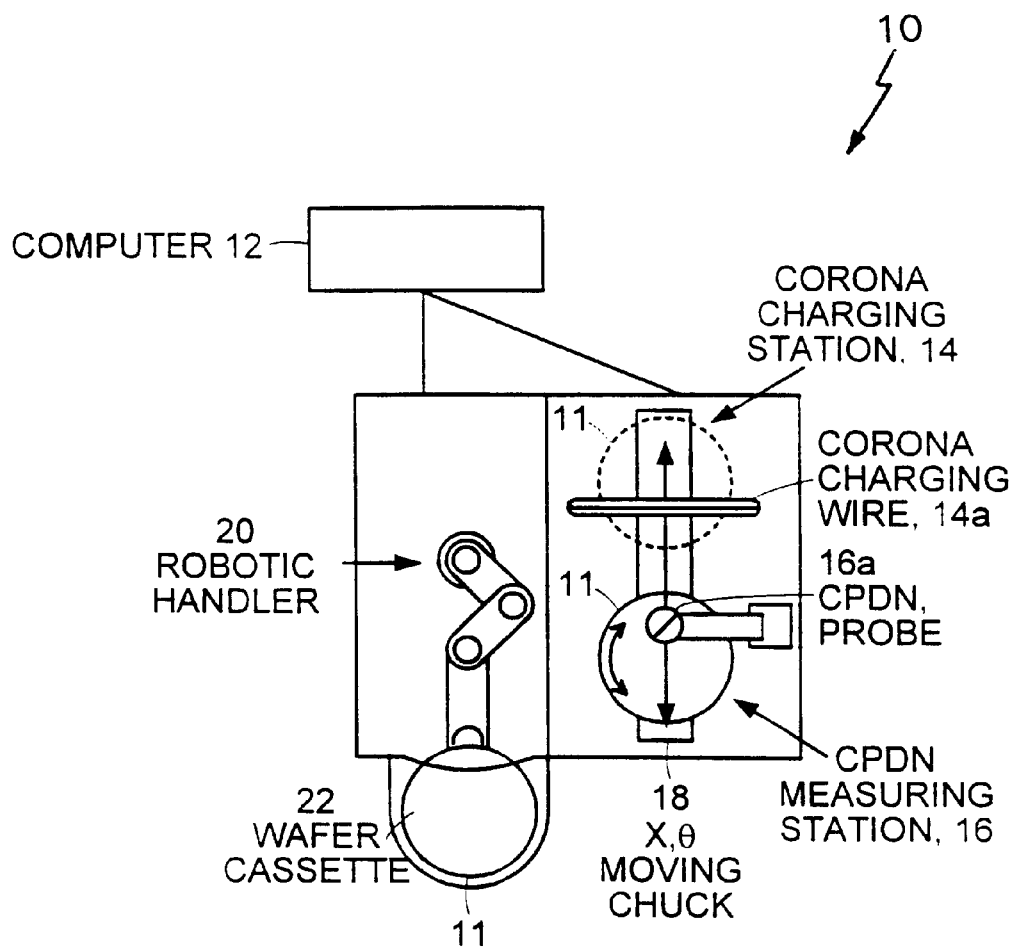
FIG. 1 is a plan view of a wafer measurement system.

Referring to FIG. 1, a computer controlled test system 10, for the measurement of interface traps at an interface between an oxide layer and a semiconductor wafer 11, is shown. Test system 10 includes a computer 12 that controls the system 10 and provides calculations of various parameters from measurements made in the system 10. The system 10 includes a corona charging station 14, a charge measurement station 16, a moving chuck 18, a robotic wafer handler 20 and wafer cassette holder 22 for moving wafers 11 about the stations of the system 10.

The corona charging station 14 includes a corona charging wire 14a which receives a high voltage potential of either a positive or negative polarity as needed, and in a known manner deposits corona charge on the wafer 11.

Figure 2:
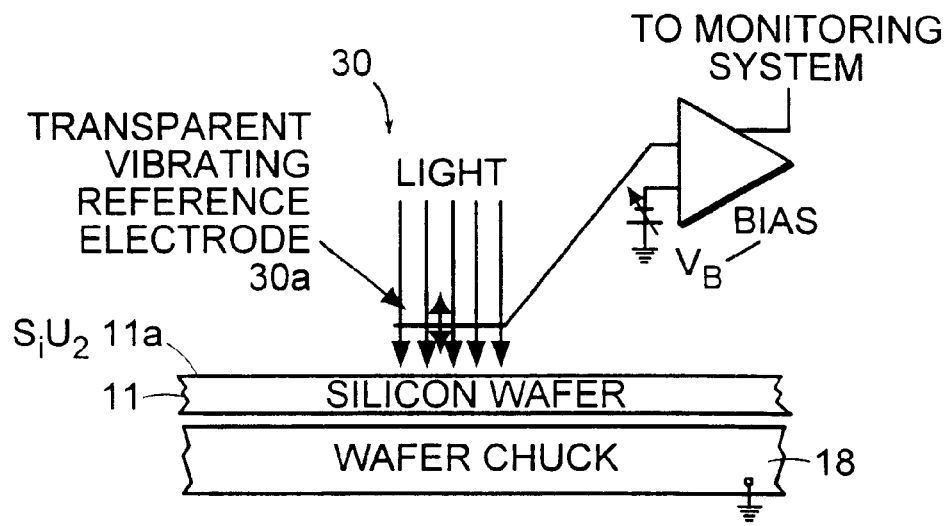
FIG. 2 is a pictorial representation of configuration of a Kelvin probe for measurement of contact potential difference.
Figure 3:
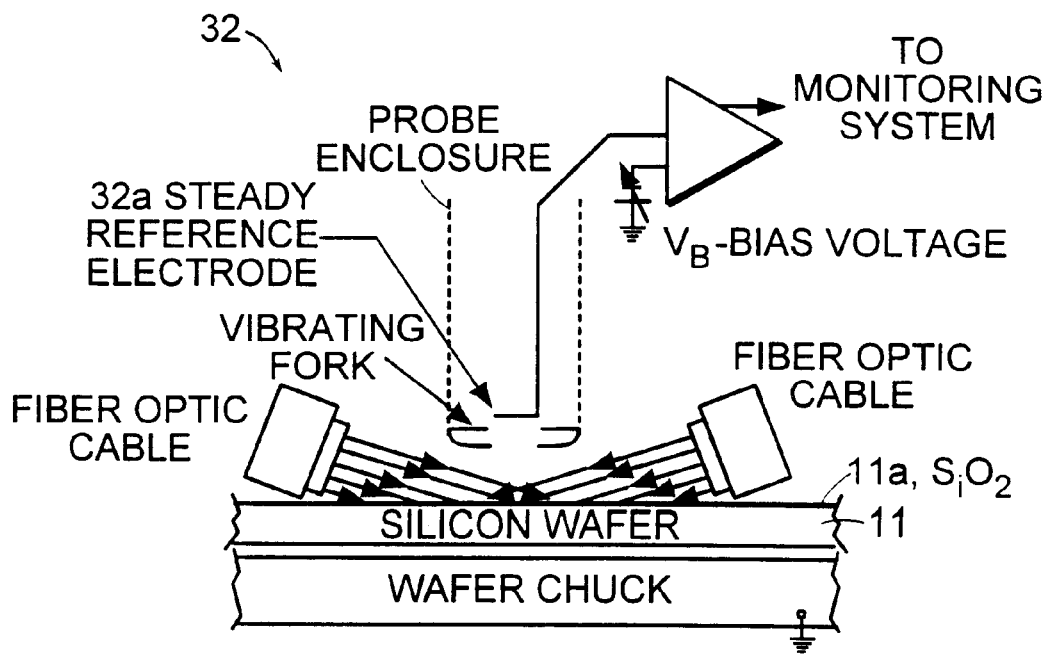
FIG. 3 is a pictorial representation of a configuration of a Monroe probe for measurement of contact potential difference in the dark and under illumination.

Referring now to FIGS. 2 and 3, the charge measurement station 16 has a Kelvin probe sensor 30 (FIG. 2) or a Monroe-type sensor 32 (FIG. 3) which is used to measure the contact potential of an oxide surface 11a with respect to a reference electrode 30a (FIG. 2) or 32a (FIG. 3), i.e., the contact potential difference $V_{cpd}$ respectively. Measurements of the $V_{cpd}$ are done in the dark and with light illuminating the wafer surface under the electrodes as illustrated. For the Kelvin probe light passes through the electrode 30a whereas for the Monroe probe 32 light is directed towards the surface by disposing a pair of light sources (via fiber optic cable) at angles to the substrate. The measuring and charging stations are confined in a dark box to eliminate the stray light interference. In use, the electrodes 30a or 32a are separated from wafer 11 by an air gap, a fraction of a millimeter wide. These sensor types are described, respectively, in G. W. Reedyk and M. M. Perlman: Journal of the Electrochemical Society, Vol. 115, p. 49 (1968); and in R. E. Vosteen: Conference Records, 1974 IEEE-IAS 9th Annual Meeting, p. 799, the entire contents of which are incorporated herein by reference. An example of a commercially available device is the Isoprobe model 162 by Monroe Electronics, Lyndonville, N.Y. 14098. The Monroe probe is preferred for the $V_{CPD}$ measurements.

Charge measurement station 20 whether using the Kelvin CPD or Monroe CPD probe type rely upon monitoring changes in a.c. current given by the equation $$J=(V_{CPD}+V_B)dC/dt.$$

In the above equation C is the capacitance between the probe and the wafer periodically varied by vibrating the probe (Kelvin configuration) or the fork (Monroe configuration). In compensating measurements $V_{CPD}$ is obtained from the value of the bias voltage $V_B$ corresponding to J=0 as $V_{CPD}=-V_B$ for J=0. Alternatively, J vs. $V_B$ is calibrated and can be obtained from the measured value of the current. The latter method is faster and it is a preferred one for the wafer scale CPD mapping. The probes have provisions for illumination of the wafers. The light should be intense enough to flatten the semiconductor bands near the surface giving $V_s \cong 0$. For this reason strongly absorbed light of high intensity is used. The illumination does not change $V_{ox}$ shown in FIG. 3 and therefore the measurement of $V_{CPD}^{ILL}$ under illumination and $V_{CPD}$ under dark conditions gives:

$$V_s \cong \Delta V_{CPD} = V_{CPD}^{DARK} - V_{CPD}^{ILL}$$

Figure 4:
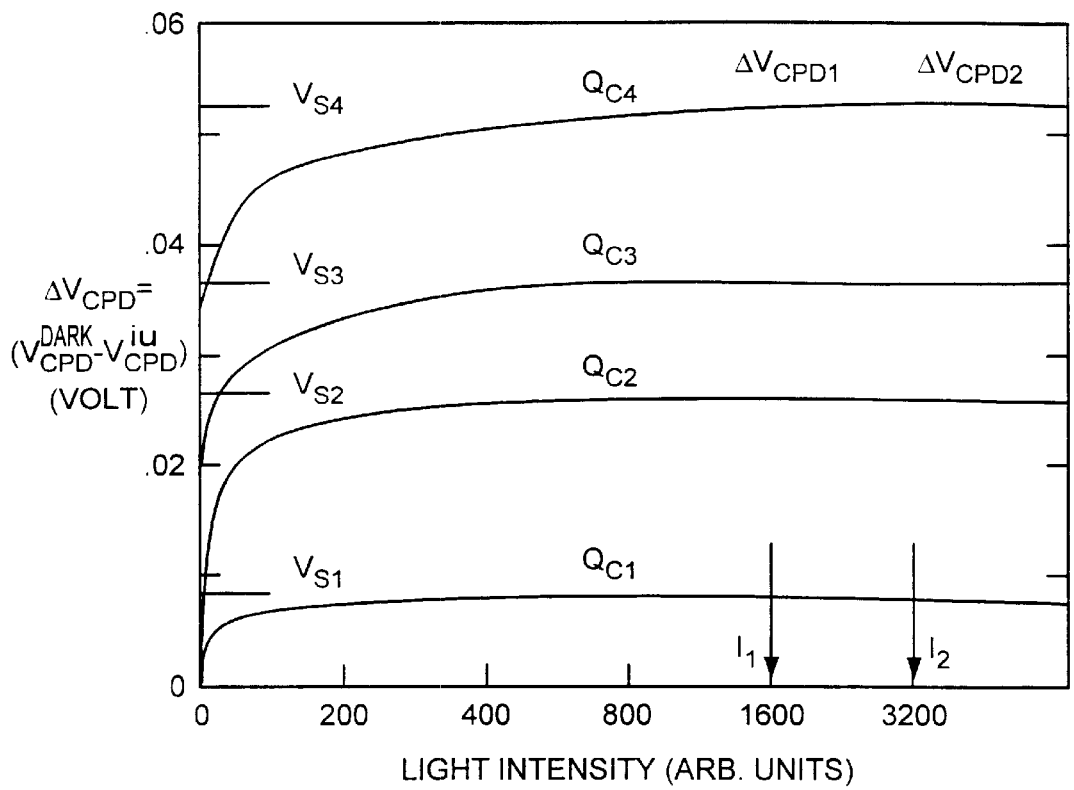
FIG. 4 is a plot of change in $V_{CPD}$ vs. light intensity for different corona charge doses.
Figure 4A:
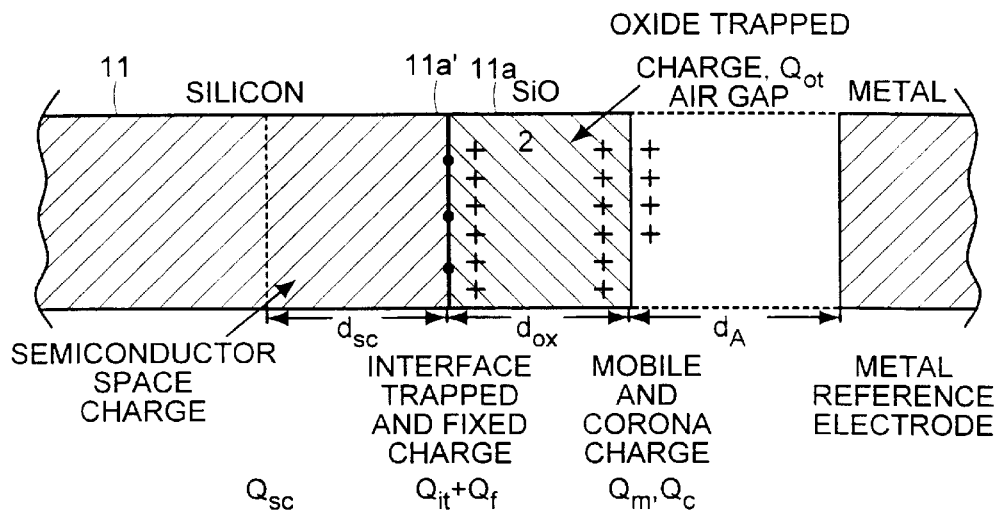
FIG. 4A is a cross sectional view of a semiconductor wafer having an oxide layer separated from a reference electrode by an air gap.
Figure 4B:
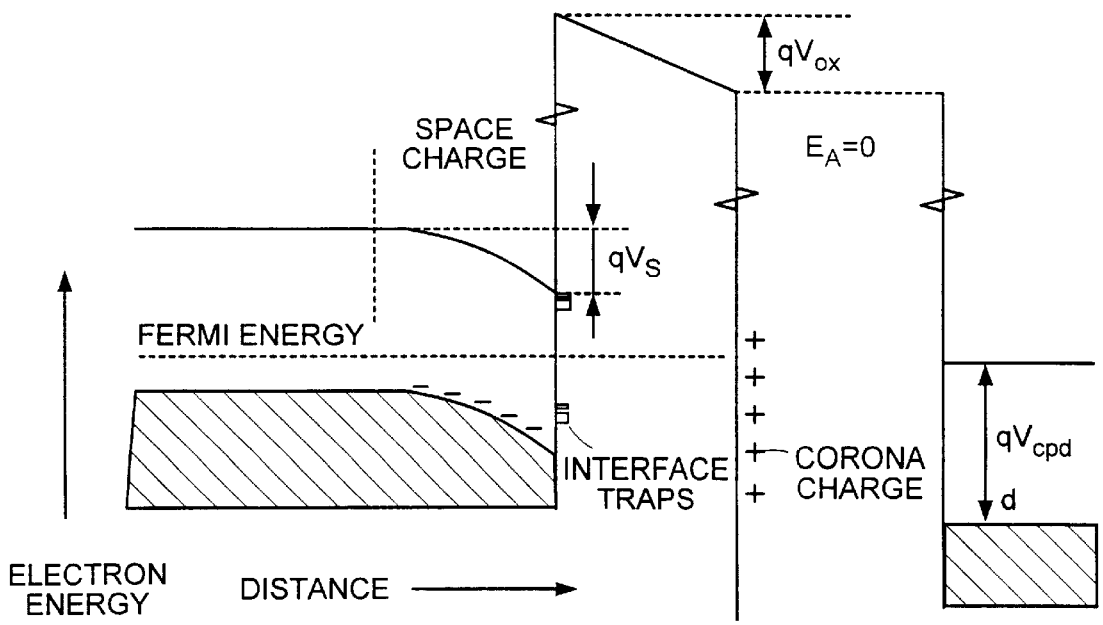
FIG. 4B is an energy band diagram corresponding to the arrangement of FIG. 4A.

As shown in FIG. 4, the illumination induced change in the $V_{cpd}$ saturates for high light intensity. This saturation takes place when the energy bands become practically flat at the surface (i.e., $V_s=0$). For an accurate determination of the surface potential barrier, $V_s$, the saturation condition is checked by measuring $\Delta V_{cpd}$ at two different illumination intensities $I_1$ and $I_2$ (i.e, by inserting a neutral density filter into a light path). In typical silicon wafers, for $I_2/I_1=2$ the corresponding ratio $\Delta V_{cpd2}/\Delta V_{cpd}$ is <1.025 to assure $V_s$ measuring accuracy of about 5% for depletion and weak inversion type of the surface barrier presently considered. Once $V_s$ is determined the corresponding value of the space charge is obtained in accordance with:

$$Q_{tot}=-Q_{sc}=\pm\sqrt{2}(K_s\epsilon_0/\beta L_D)\cdot F(V_s)$$

$$F(V_s)=\{(e^{-\beta V_s}+\beta V_s-1)+n_o/p_o(e^{\beta V_s}-\beta V_s-1)\}^{1/2}$$

where F is the space charge function that relates the surface barrier to the net value of the surface charge, $L_D$ is the extrinsic Debye length for holes, $L_D$ is $(K_s\epsilon_0/qp_o\beta)^{1/2}$ $n_o$ and $p_o$ are the concentration of minority free electrons and majority holes respectively, $\beta \leq q/kT$, q is the elemental charge and kT is the thermal energy; $K_s\epsilon_0=\epsilon_s$ is the permittivity of the semiconductor wafer. The present method is applicable only for depletion-inversion type of the surface barrier limited to:

$$0 \leq V_s \leq (2kt/q)\ln(N_A/n_i)$$

for p-type silicon, and $$0 \leq |-V_s| \leq (2kT/q)\ln(N_D/n_i))$$

for n-type silicon, where $N_A$ and $N_D$ are the acceptor and donor concentrations respectively and $n_i$ is the intrinsic carrier concentration. It should be noted that for p-type silicon $P_o=N_A$, while for n-type silicon $p_o$ in the space charge equation should be replaced by $N_D$.

Referring to FIG. 1, the charge station 14 deposits charge on the entire oxide surface of the wafer 11. The corona charging arrangement 14 is similar to that used in photocopiers. It includes a wire 14a connected to a high DC voltage source (not shown). The charge deposited on the wafer 11 is precisely controlled by the voltage, the corona current and the speed at which the wafer passes under the wire 14a. A precise dose of charge is controlled by the number of passes of the wafer under the wire 14a.

The quantitative corona charging characteristics, e.g. the charge versus corona voltage and current, and the wafer passing speed are determined empirically and are introduced into computer software, controlling the corona charging station.

Test system 10 further includes a wafer cassette holder 22 for storing the semiconductor wafers to be tested and a prealigning stage (not shown) for accurate positioning of the wafer as it is moved from device to device, thereby minimizing positioning errors from measurement to measurement. The prealigner station is used for pre-orientation of the wafer prior to measurement by using a notch or flat made by wafer manufacturers near the edge of the circular wafer for exactly that purpose. The computer 12 controls robotic wafer handler 20 and transmits controls signals to and receives data signals from wafer cassette holder 22, charge measurement station 16, and corona discharge station 14. In general, measurements are carried out at 22° C.

The corona charge placed on the oxide induces opposite polarity, identical value charge in the semiconductor material. A portion of this induced charge remains in the semiconductor surface space charge region and another portion is trapped by the interface traps. The semiconductor space charge $Q_{sc}$ is calculated from the measured value of the surface barrier using the electrostatic space charge equation. Then the part of the charge trapped is determined by the difference between the applied corona charge and the charge remaining in the semiconductor space charge.

The method is limited only to depletion and weak inversion because the measurement of the surface barrier through the change of $V_{CPD}$ under illumination severely underestimates $V_s$ for the accumulation and the deep inversion conditions.

Referring now to FIG. 3, measurement of the interface trapped charge $\Delta Q_{it}$ can be explained using the electrical neutrality principle. Prior to corona charging $$Q_{sc}+Q_{it}+Q_{ox}=0$$

where $Q_{ox}$ is the sum of all oxide charges. After depositing corona charge dose, $\Delta Q_c$, the charge neutrality is $$Q_{sc}+\Delta Q_{sc}+Q_{it}+\Delta Q_{it}+Q_{ox}+\Delta Q_{ox}+\Delta Q_c=0.$$

From these two relationships, $\Delta Q_{it}$ can be determined as $\Delta Q_{it}=-(\Delta Q_c+\Delta Q_{sc})$, because $\Delta Q_{ox}=0$. Since $\Delta Q_c$ is known and $\Delta Q_{sc}$ is determined by the $V_s$ measurement, $\Delta Q_{it}$ can also be determined. Knowing the corresponding change of the surface barrier $\Delta V_s$ the density of the interface trap charge, $D_{it}$ (defined as $D_{it}=1/q$ $(d\Delta Q_{it}/d\Delta qV_s))$ can be calculated.

Figure 5A:
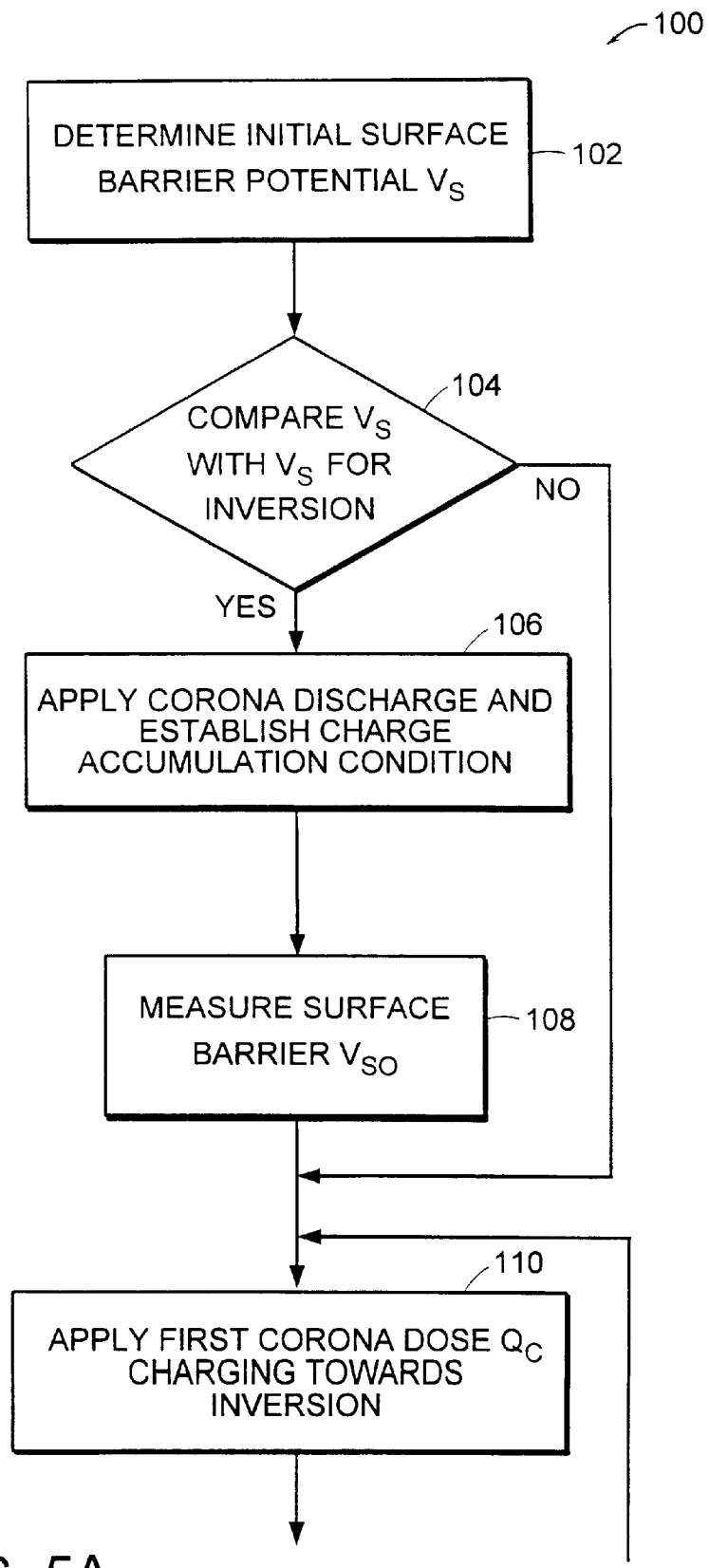
FIGS. 5A–5C are flow diagrams of a technique for measuring charge distribution associated with interface traps.
Figure 5B:
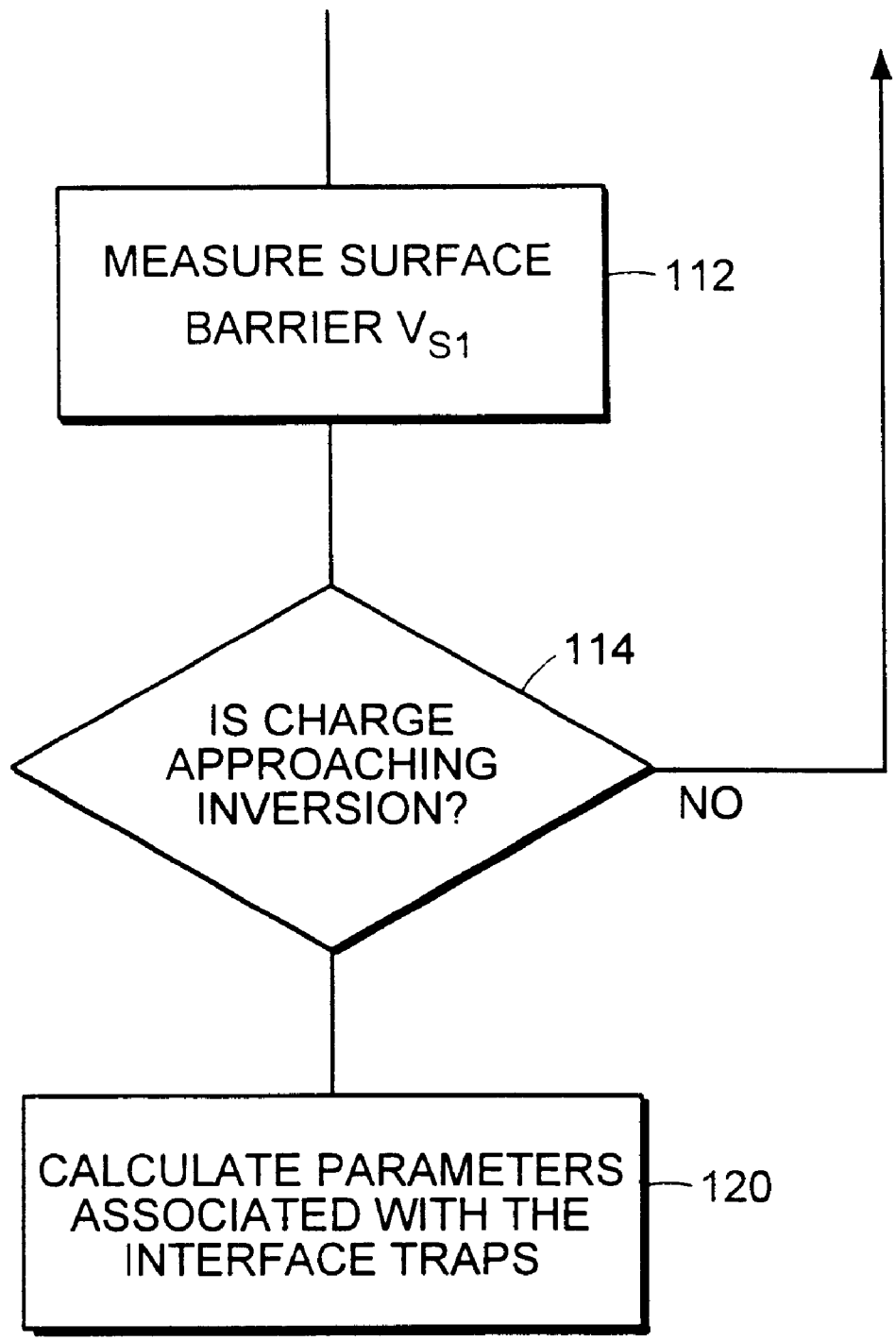
Figure 5C:
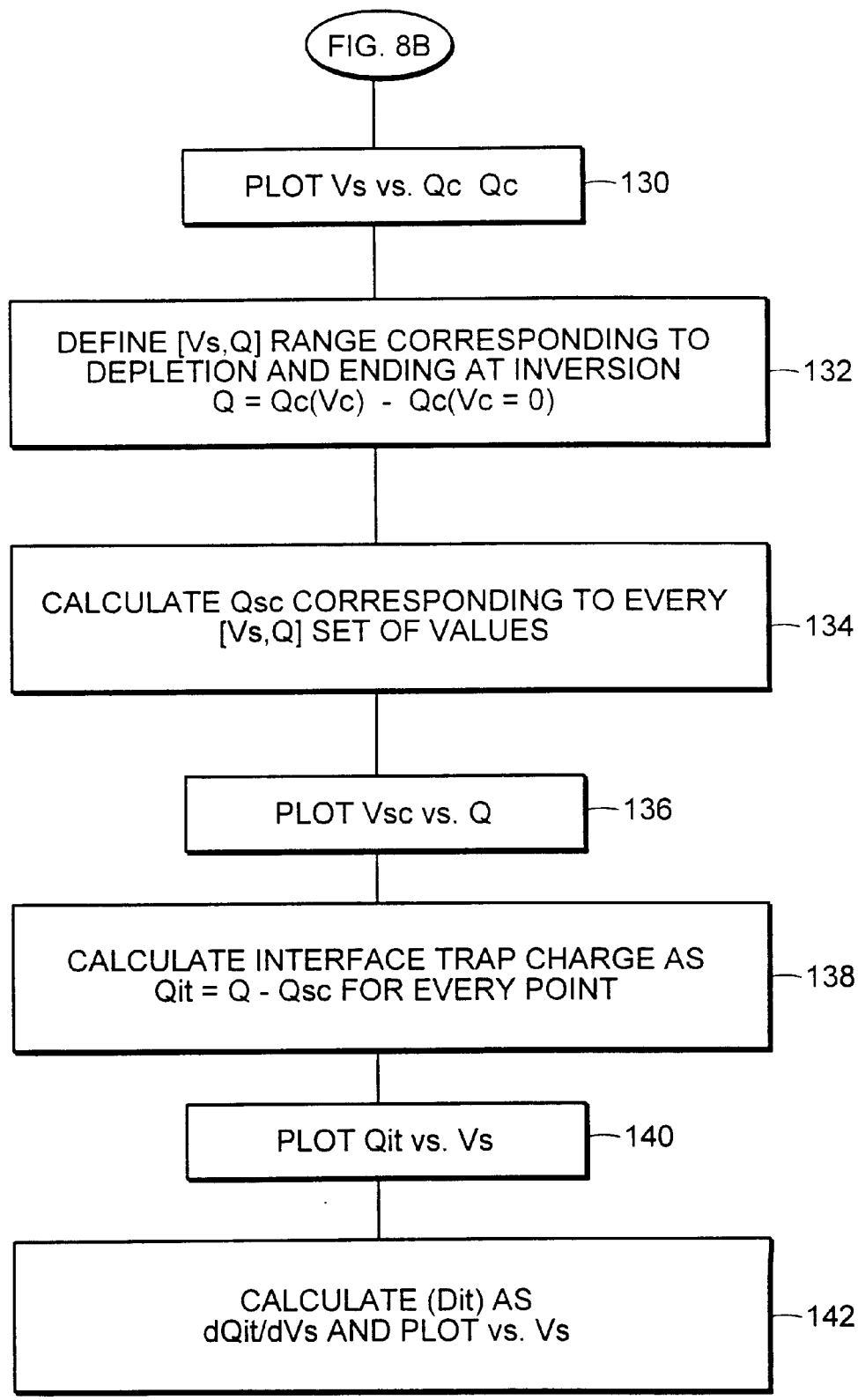

Referring now to FIGS. 5A–5C, a process 100 for measuring the charge associated with interface traps is shown to include a step 102 of determining an initial surface potential barrier ($V_s$). The initial surface barrier of the wafer 11 is measured by having the wafer cassette holder 22 deliver via the robotic handler arm 20 a wafer to the moving chuck 18 under the probe 16a at the CPD/$V_s$ measuring station 16. After this initial measurement of surface potential barrier $V_s$, the measured value of $V_s$ is compared with the value of $V_s$ at inversion $$V_{inv}=(2kt/q)\ln(N_A/n_i)$$

and the charge dose is estimated in accordance with well known calculations needed to change the barrier to weak accumulation, at step 104. If at step 104 the value determined at step 102 is not in accumulation (i.e, $V_s$ is not negative for p-type silicon) then the moving chuck 18 places the wafer in the corona charging station 14 and applies corona charge to establish a charge accumulation condition in the wafer at step 106. The surface barrier potential $V_s$ is optionally measured at step 108 to insure that it is now in a surface accumulation condition. In either event from either step 104, or steps 106 or 108 as shown, a first, controlled small corona dose $Q_c$ is applied at step 110 to the wafer via operation at corona charging station 14. If in step 102 the surface barrier is in accumulation, then steps 106 and 104 are omitted.

The surface potential barrier $V_s$ is measured at step 112 for a plurality of regions on the wafer 11. The contact potential distribution is measured in the form of an X-θ movement on the surface of the wafer providing values of $V_s$ for each of the plurality of measurement regions on the wafer 11. This measurement occurs for each one of the corona charge doses that will be imparted to the surface of the oxide layer 11a. For each of the measurements of surface potential barrier a value of space charge is calculated. The values of space charge as well as values corresponding to interface trap density are calculated at each measurement location along the surface of the oxide layer 11a.

The measured surface potential barrier $V_s$ is examined to determine whether the charge condition is approaching an inversion condition in the semiconductor wafer 11. If an inversion condition is approached, charging and measuring steps terminate and parameters associated with the interface traps are calculated at step 120. Otherwise, a subsequent dose of a corona charge is applied again at step 110 and the characteristics are measured again at step 112. The sequence of steps 110, 112 and 114 are repeated a plurality of times until the surface barrier potential $V_s$ as determined at step 114 approaches a charge inversion condition. A charge inversion condition can be determined by examination of a previous value $V_s$. When $V_s$ reaches a maximum value, that is, there is no substantive change in the value of $V_s$ with adding the corona charge, then an inversion condition has been arrived at and thus the charging and measuring process terminates and parameters are calculated at step 120. In practice a threshold can be established, that is, if the $V_s$ value is within 50 mV from $V_{inv}$ value calculated in step 104, the wafer 11 can be considered at an inversion state.

Similarly, a charge accumulation condition which is used in steps 106, 108 to determine initial condition of the surface of the wafer 11 is determined by examination for a change in sign in the surface potential barrier. That is, as the value of $V_s$ goes towards zero and changes sign a charge accumulation condition has been provided in the space charge layer.

Thus, corona charge is placed over the oxide layer 11a in small precise dosages. The application of the corona charge changes the surface potential barrier from an accumulation condition as initially determined in step 108 to inversion condition as determined in step 114. This change in condition is determined by monitoring the value of the surface potential barrier $V_s$ after each corona dose in step 110 by measuring a change in contact potential difference induced by strong illumination through all of the portions of the wafer 11.

Referring now to FIG. 5C, having applied measured corona doses of charge on the substrate and measured surface barrier potential, $V_s$, over a plurality of locations on the substrate, various parameters which characterize the substrate can be determined. For example, as shown in FIG. 5C, the computer 12 can provide a plot of the surface potential barrier, $V_s$, vs. total corona charge, $Q_c$, as shown in step 130.

At step 132, a range of values $[V_s, Q]$ corresponding to the state of the wafer starting at depletion can be defined as $Q=Q_c(V_c)-Q_c(V_s=0)$. At step 134 the space charge $Q_{sc}$ corresponding to each one of the $[V_s, Q]$ set of values is determined in accordance with:

$$Q_{tot} = -Q_{sc} = +\sqrt{2}\,(K_s\epsilon_0/\beta L_D)\cdot F(V_s)$$

$$F(V_s) = [(e^{-\beta V_s}+\beta V_s - 1) + n_o/p_o(e^{\beta V_s}-\beta V_s - 1)]^{1/2}$$

$$\simeq [(e^{-\beta V_s}+\beta V_s - 1)]^{1/2}$$

for p-type wafers, as mentioned above.

At step 136 a plot of $Q_{sc}$ vs. Q can be provided and at step 138 the computer 10 can calculate the interface trap charge as $Q_{it}=-Q-Q_{sc}$ for every point determined in conjunction with FIGS. 5A–5B. At step 140 a plot of interface trap charge $Q_{it}$ vs. $V_s$ can be provided and at step 142 the calculation of interface trap density ($D_{it}$) can be provided as $D_{it}=|1/q(dQ_{it}/dV_s)|$ which is plotted vs. $V_s$.

The process described above in conjunction with FIGS. 5A–5B is particularly valid for testing of P-type doped silicon. In general, small doses of corona charging are more uniform for positive type of corona than for negative type of corona. Thus for the p-type silicon initially the silicon is placed in a charge accumulation state and positive doses of corona are applied to the wafer to bring the wafer to a charge inversion layer state.

For determining the characteristics of n-type silicon, it is preferable to maintain small positive corona doses. Accordingly, the process for n-type silicon is essentially the same as that described above for p-type silicon except that at step 104 the N-type wafer is tested to determine whether it is at accumulation and if it is, at step 106 a corona discharge is applied to the wafer to establish a charge inversion condition. Subsequent steps, therefore, move the inversion condition of the interface towards a charge accumulation condition and, thus, at step 114 the measurement is checked to determine whether the layer is in a charge accumulation condition. Charge accumulation can be detected when the surface potential $V_s$ passes through zero and changes sign. The other calculations as described in conjunction with FIG. 5C remain essentially the same. All charges however will have sign opposite to that in p-type silicon.

Figure 6:
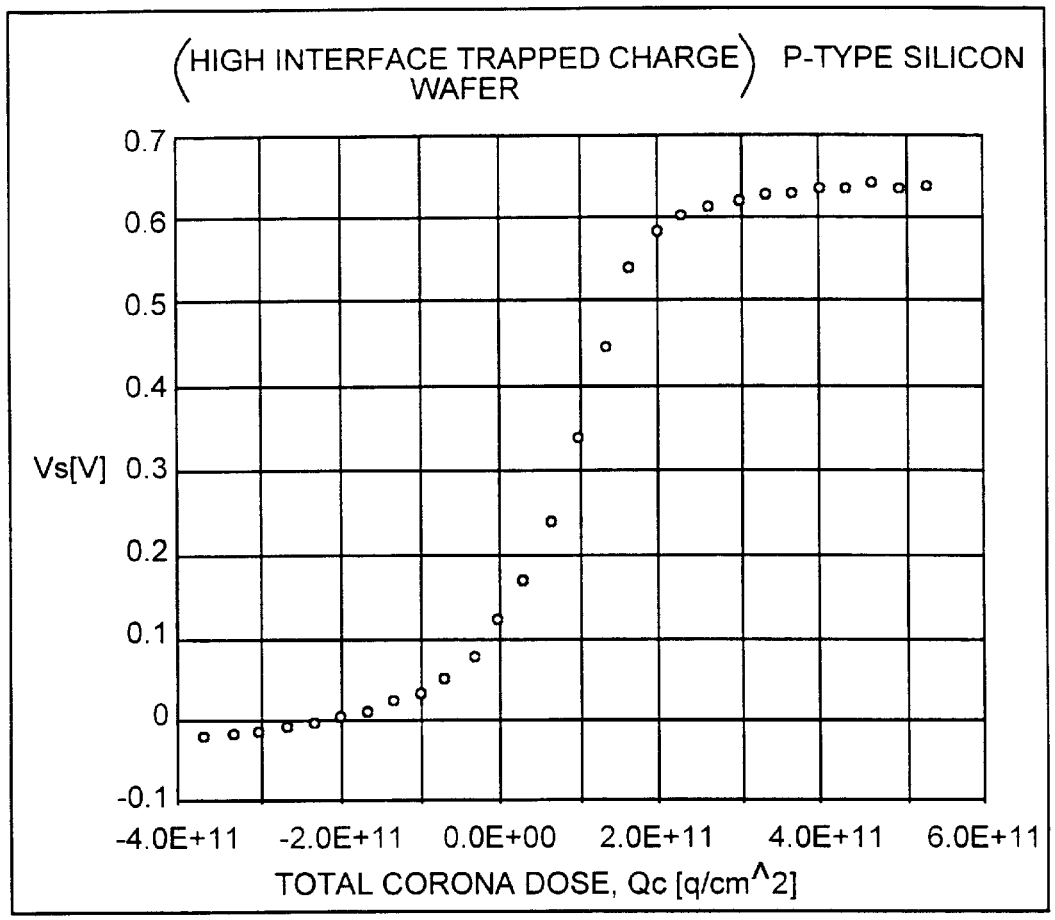
FIG. 6 is a plot of surface potential barrier versus corona charge.
Figure 7:
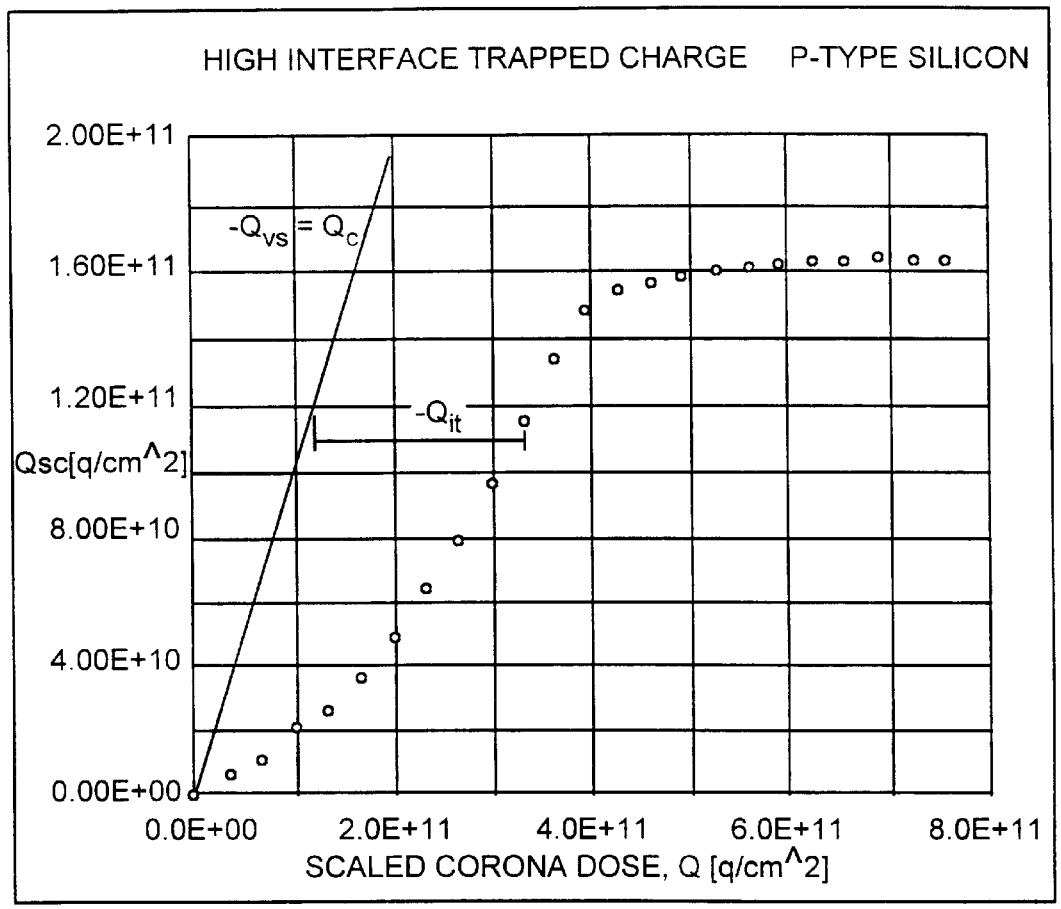
FIG. 7 is a plot of space charge versus corona charge.
Figure 8:
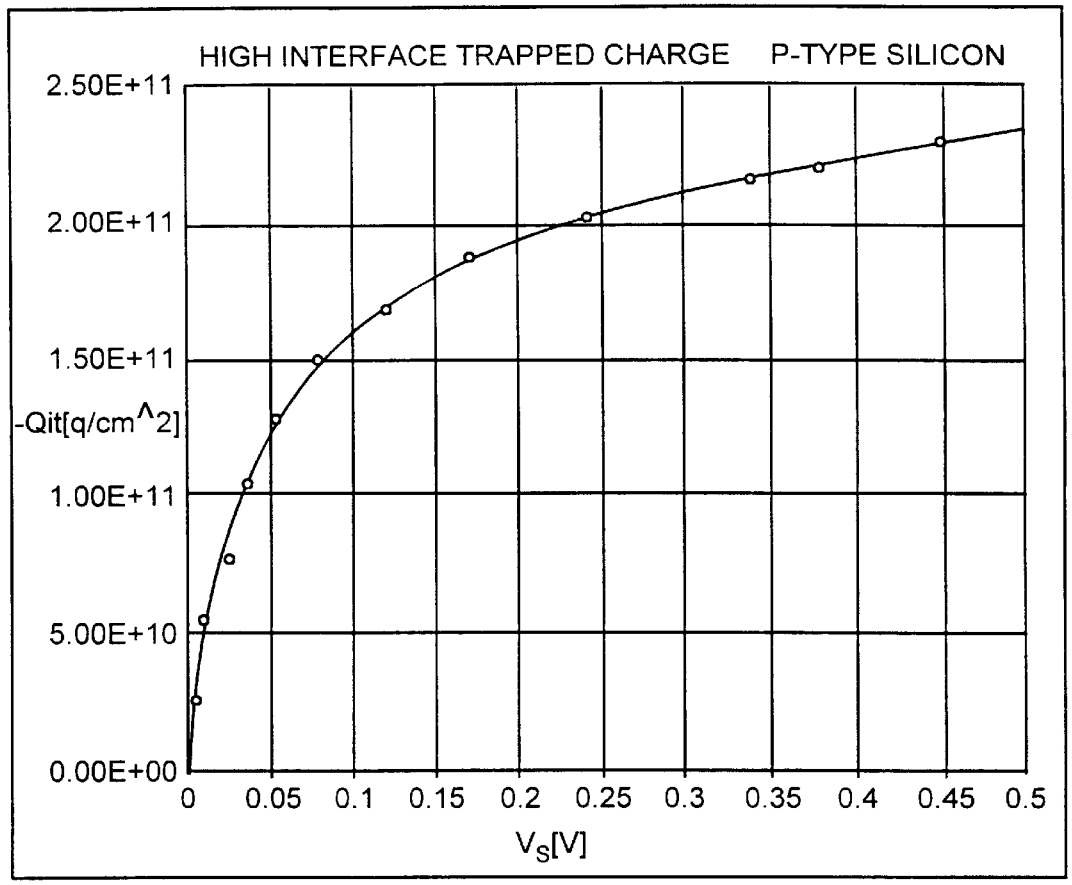
FIG. 8 is a plot of the interface trap charge versus surface potential barrier.
Figure 9:
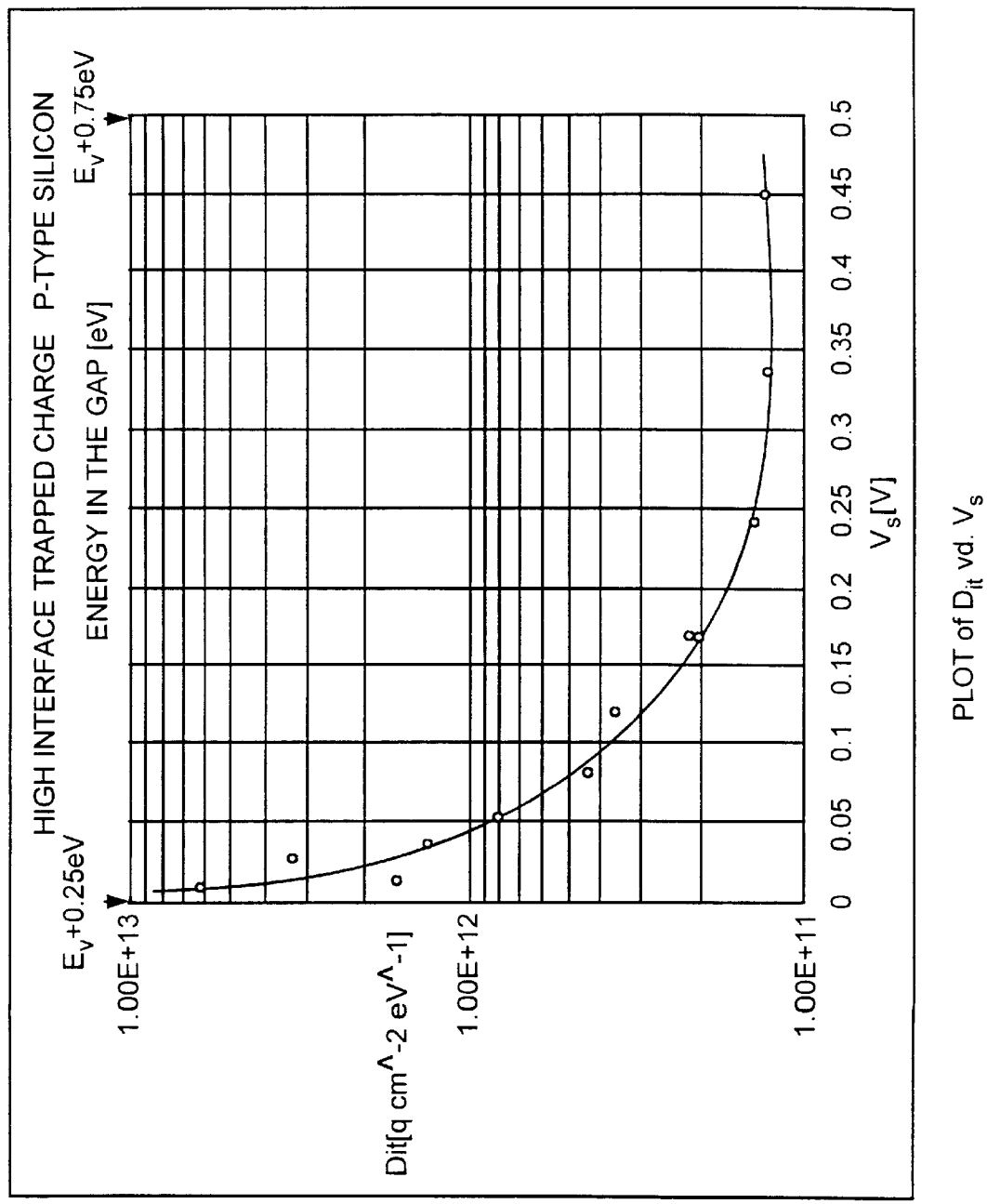
FIG. 9 is a plot of the interface trap density versus surface potential barrier.

Referring now to FIGS. 6–9, various plots which characterize the interface trap of the $SiO_2$ silicon wafer interface are shown. FIG. 6 shows a plot of surface potential $V_s$ vs the total corona dose $Q_c$ as set forth in step 130. FIG. 7 shows a typical plot of space charge $Q_{sc}$ vs corona dosage Q scaled for the depletion-inversion range as shown in step 136. FIG. 8 shows a plot of interface trap charge $Q_{it}$ vs $V_s$ corresponding to step 140. FIG. 9 shows a plot of $D_{it}$ vs $V_s$ corresponding to step 142.

Figure 10A:
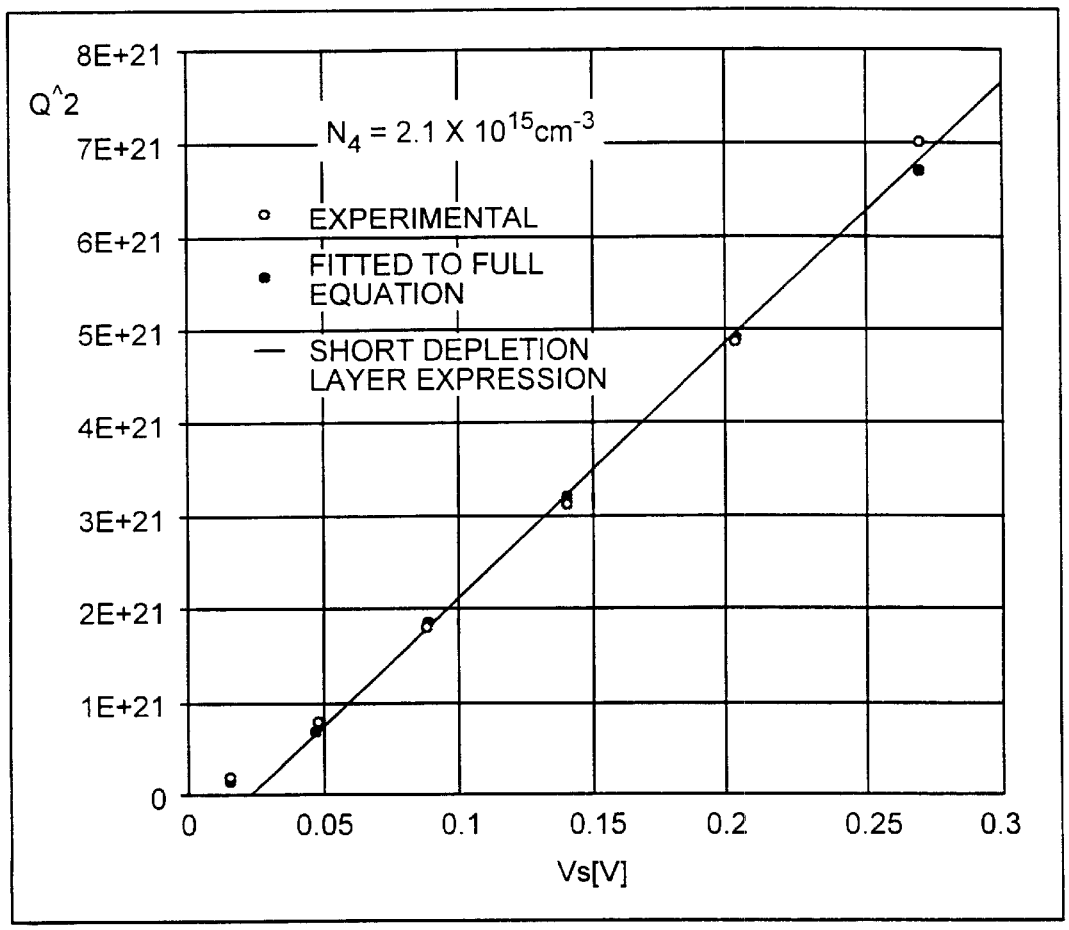
FIGS. 10A and 10B are plots of charge vs. $V_s$ useful in measuring dopant density.
Figure 10B:
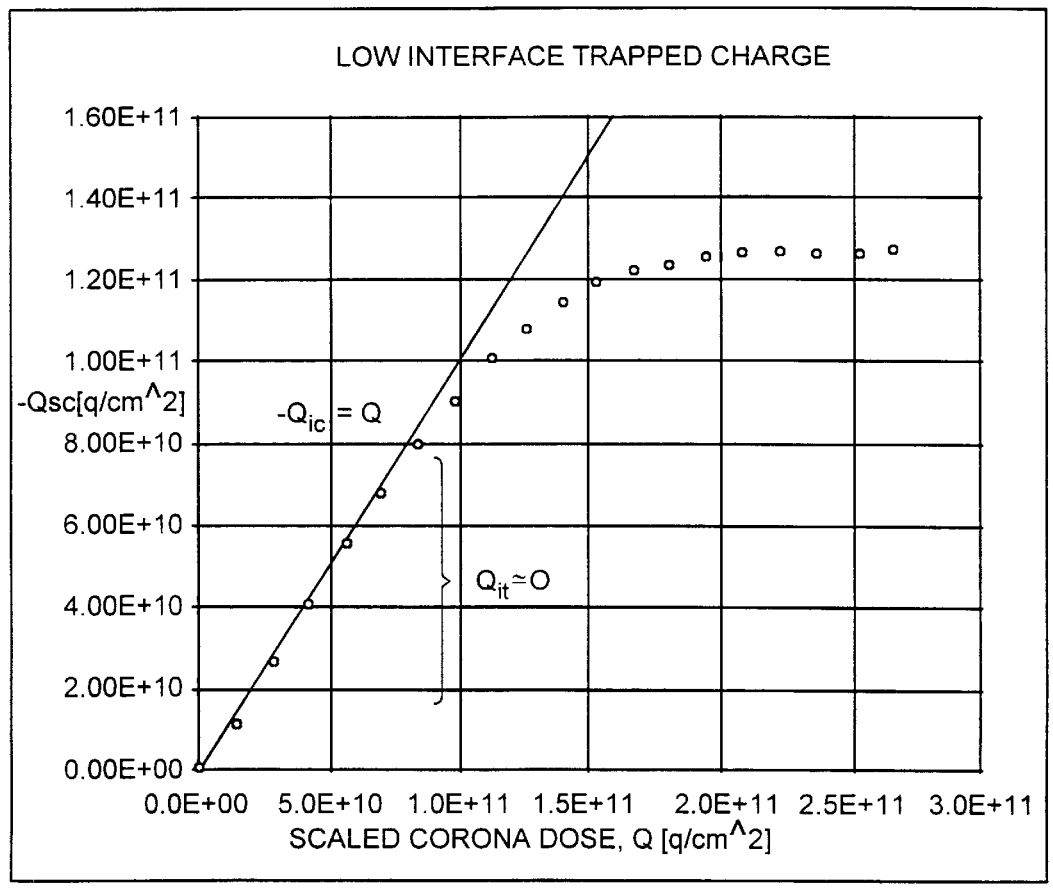

Referring now to FIGS. 10A–10B, further use of the arrangement is depicted. Often times a silicon dioxide layer disposed over a silicon layer provides a substantially perfect or near perfect interface having a relatively small amount of traps associated therewith. This is particularly true for the gate oxide $SiO_2$ layers deposited in circuit fabrication. In this instance the apparatus and method can provide a technique for a non-contact determination of dopant concentration in an oxide and silicon wafer. Corona discharge $Q_c$ is provided in measured doses over the top of the silicon oxide layer in small precise increments changing the surface barrier from accumulation to inversion as generally described in conjunction with FIGS. 5A–5B.

The value of the surface potential barrier is monitored after each dose by measuring a change in the contact potential difference induced by strong illumination and is given as:

$$V_s = V^{DARK}_{cpd} - V^{ILL}_{cpd}$$

as mentioned above.

Plots of $V_s$ vs $Q_c$ as shown in FIGS. 10A and 10B are used to define (Q, $V_s$) range corresponding to a surface depletion layer where Q is defined as $Q=Q_c(V_s)-Q_c(V_s=0)$. The square of the charge Q is plotted versus $V_s$. For low densities of interface states, that is, with a substantially clean interface between the silicon and silicon dioxide, when $Q_{it}$ is less than $1 \times 10^{10}$ qcm$^{-2}$ or $D_{it}$ is $\leq 5 \times 10^{10}$ qcm$^{-2}$eV$^{-1}$; the plot $Q^2$ should be linear with $V_s$ for $V_s > kT/q$. The dopant concentration is determined from the depletion space charge relationship as $$Q^2 = 2q\epsilon_s N_A (V_s - kT/q) \text{ for } V_s > kT/q$$

$$N_A = (2q\epsilon_s)^{-1} \cdot \Delta Q^2 / \Delta V_s$$

Alternatively, all depletion layer points can be fitted to full depletion charge relationship $$Q^2 = 2q\epsilon_s N_A \{(V_s + kT/q - \exp(-qV_s/kT)\}$$

which does not require the rejection of points corresponding to low $V_s$ values. Computer fitting can be used to determine the value of $N_A$. Both procedures are illustrated in conjunction with FIGS. 10A and 10B.

Having described preferred embodiments of the invention, other embodiments incorporating its concept may be used. It is felt, therefore, that this invention should not be limited to the disclosed embodiments, but rather should be limited only by the spirit and scope of the appended claims.

We claim:

1. A method of determining charge associated with traps present in a semiconductor oxide interface between a semiconductor wafer and an oxide layer disposed on the wafer, the method comprising the steps of:

depositing a dose of charge over a portion of a surface of the oxide layer;

measuring a resultant value of surface potential barrier at the portion of the surface of the oxide layer; and determining a value of charge associated with interface trap from the surface potential barrier and the deposited charge dose.

2. The method as recited in conjunction with claim 1 wherein the determining step further comprises the step of determining space charge corresponding to the measured surface potential barrier of the portion of the wafer.

3. A method of determining charge associated with traps in a semiconductor oxide interface between a semiconductor wafer and an oxide layer disposed on the wafer, the method comprising the steps of:

determining an initial surface potential barrier of the oxide layer;

if the initial surface potential barrier is not in an accumulation condition, applying corona discharge to cause a charge accumulation condition;

depositing a charge dose over the wafer;

measuring the surface potential barrier over a plurality of locations of said wafer; and for each of said measured differences, determining whether the surface potential barrier is within a threshold value approaching an inversion condition;

continuing to deposit, charge and measure surface potential barrier over a plurality of regions of the wafer, until the surface potential barrier approaches a constant deep inversion level as a function of deposited charge; and calculating parameters associated with the interface trap charge from the measured values of surface potential barrier at inversion and deposited charge dosage levels.

4. An apparatus for determining charge associated with traps present in a semiconductor oxide interface between a semiconductor wafer and an oxide layer disposed on the wafer, the method comprising:

a corona discharge station for depositing a dose of charge over a surface of a oxide;

a measuring station for measuring a resultant value of surface potential barrier;

a computer for determining from the surface potential barrier and the deposited charge dose a value of charge associated with interface traps.

5. The apparatus of claim 4 wherein the corona discharge station includes a corona charging wire that can be coupled to a high voltage.

6. The apparatus of claim 5 wherein the wire delivers a small controlled dose of charge.

7. The apparatus of claim 6 wherein the measurement station includes a probe to measure contact potential difference.

8. The apparatus of claim 7 wherein the probe is a Kelvin probe or a Monroe probe.

9. The apparatus of claim 4 wherein the computer determines charge associated with interface traps by determining space charge corresponding to the measured surface potential barrier of the portion of the substrate.

10. The apparatus of claim 4 wherein the computer determines charge associated with interface traps by the equation:

$$\Delta Q_{it} = -(\Delta Q_c + \Delta Q_{sc})$$

11. A method of determining dopant concentration of a semiconductor comprises the steps of:

depositing doses of charge over a surface of the oxide in measured doses of small precise increments changing the surface barrier from an accumulation to an inversion condition;

measuring a resultant value of surface potential barrier, $V_s$ at the surface defining (Q, $V_s$) range corresponding to a surface depletion layer where Q is defined as $Q=Q_c(V_s)-(V_s=0)$; and determining from the surface potential barrier and the deposited charge dose a value of dopant concentration in accordance with the equation, $$Q^2 = 2q\epsilon_s N_A (V_s - kT/q) \text{ for } V_s > kT/q.$$

12. A method of determining charge associated with traps present in a P-type semiconductor/oxide interface comprises:

depositing a dose of charge over a surface of the oxide;

measuring a resultant value of surface potential barrier at the portion of the surface;

determining from the surface potential barrier the space charge for surface depletion layer; and determining a value of charge associated with the interface trap from the space charge and the deposited charge dose.

13. The method of claim 12 further comprising the step of:

determining whether the surface is in an initial surface potential barrier condition of accumulation.

14. The method of claim 13 wherein if the surface is not in the initial surface potential barrier condition, establishing the condition by applying corona discharge over the surface.

15. The method of claim 14 wherein for P-type semiconductor material the condition is established by applying corona discharge to cause a charge accumulation condition.

16. The method of claim 14 wherein for N-type semiconductor material the condition is established by applying corona discharge to cause a charge inversion condition.

17. A method of determining charge associated with traps in a p-type semiconductor/oxide interface comprises:

determining an initial surface potential barrier of the oxide;

if the initial surface potential barrier is not in an accumulation condition potential, applying corona discharge to cause a charge accumulation condition;

depositing a charge dose over the wafer;

measuring the surface potential barrier over a plurality of locations of said wafer; and for each of said measured barriers, determining whether the surface potential barrier is within a threshold value approaching the inversion condition;

continuing to deposit charge and to measure surface potential barrier over a plurality of regions of the wafer, until the surface potential barrier approaches a constant deep inversion level as a function of deposited charge;

calculating from the surface potential barrier the space charge for surface depletion layer; and determining from the space charge and the deposited charge dose, a value of charge associated with the interface trap.

18. The method of claim 17 further comprising producing a mapping of interface trap distribution over different measurement sites on the semiconductor surface.

19. The method of claim 18 further comprising producing a mapping of interface trap distribution over different measurement sites on the semiconductor surface.

20. A method of determining charge associated with traps in an N-type semiconductor/oxide interface comprises:

determining an initial surface potential barrier of the oxide;

if the initial surface potential barrier is in a charge accumulation condition potential, applying corona discharge to establish a charge inversion condition;

depositing a charge dose over the wafer;

measuring the surface potential barrier over a plurality of locations of said wafer; and for each of said measured barriers, determining whether the surface potential barrier is within the accumulation condition;

continuing to deposit charge and to measure surface potential barrier over a plurality of regions of the wafer, until the surface potential barrier approaches a constant deep inversion level as a function of deposited charge; and calculating from the surface potential barrier the space charge for surface depletion layer and from the space charge and the deposited charge dose, a value of charge associated with the interface trap.

* * * * *